United States Patent
Forbes

Patent Number: 6,093,623
Date of Patent: Jul. 25, 2000

[54] METHODS FOR MAKING SILICON-ON-INSULATOR STRUCTURES

[75] Inventor: Leonard Forbes, Corvallis, Oreg.

[73] Assignee: Micron Technology, Inc., Boise, Id.

[21] Appl. No.: 09/128,851

[22] Filed: Aug. 4, 1998

[51] Int. Cl.[7] ................................................. H01L 21/30
[52] U.S. Cl. ........................................... 438/455; 438/459
[58] Field of Search ..................................... 438/455, 459, 438/977, 406, 151

[56] References Cited

U.S. PATENT DOCUMENTS

| | | | |
|---|---|---|---|
| 3,407,479 | 10/1968 | Fordemwalt et al. | 438/406 |
| 3,457,123 | 7/1969 | Van Pul | 438/406 |
| 3,471,754 | 10/1969 | Hoshi et al. | 438/406 |
| 3,689,357 | 9/1972 | Jordan | 438/406 |
| 4,051,354 | 9/1977 | Choate | 235/312 |
| 4,561,932 | 12/1985 | Gris, et al. | 156/643 |
| 4,580,331 | 4/1986 | Soclof | 29/580 |
| 4,604,162 | 8/1986 | Sobczak | 156/657 |
| 4,625,391 | 12/1986 | Sasaki | 29/589 |
| 4,663,831 | 5/1987 | Birrittella et al. | 129/576 E |

(List continued on next page.)

OTHER PUBLICATIONS

Eaton, W.P., et al., "Wafer Bonding by Low Temperature Melting Glass", *Proceedings of the First International Symposium on Semiconductor Wafer Bonding*, Gosele, U., et al., (eds.), Electrochemical Society, Pennington, NJ, 146–152, (1992).

Horiuchi, M., et al., "A Mechanism of Silicon Wafer Bonding", *Proceedings of the First International Symposium on Semiconductor Wafer Bonding*, Gosele, U., et al., (eds.), Electrochemical Society, Pennington, NJ, 48–61, (1992).

(List continued on next page.)

*Primary Examiner*—John F. Niebling
*Assistant Examiner*—Walter L. Lindsay, Jr.
*Attorney, Agent, or Firm*—Schwegman, Lundberg, Woessner & Kluth, P.A.; Eduardo E. Drake

[57] ABSTRACT

Some advanced integrated circuits are fabricated as silicon-on-insulator structures, which facilitate faster operating speeds, closer component spacing, lower power consumption, and so forth. Unfortunately, current bonded-wafer techniques for making such structures are costly because they waste silicon. Accordingly, one embodiment of the invention provides a smart-bond technique that allows repeated use of a silicon wafer to produce hundreds and potentially thousands of silicon-on-insulator structures, not just one or two as do conventional methods. More precisely, the smart bond technique entails bonding selected first and second regions of a silicon substrate to an insulative substrate and then separating the two substrates to leave silicon protrusions or islands on the insulative substrate. The technique is also suitable to forming three-dimensional integrated circuits, that is, circuits having two or more circuit layers.

16 Claims, 3 Drawing Sheets

U.S. PATENT DOCUMENTS

| | | | |
|---|---|---|---|
| 4,673,962 | 6/1987 | Chatterjee et al. | 357/23.6 |
| 4,685,198 | 8/1987 | Kawakita, et al. | 437/73 |
| 4,755,481 | 7/1988 | Faraone | 437/62 |
| 4,761,768 | 8/1988 | Turner et al. | 365/201 |
| 4,763,183 | 8/1988 | Ng et al. | 357/23.7 |
| 4,766,569 | 8/1988 | Turner et al. | 365/185 |
| 4,845,048 | 7/1989 | Tamaki, et al. | 437/62 |
| 4,987,089 | 1/1991 | Roberts | 437/34 |
| 5,001,526 | 3/1991 | Gotou | 357/23.6 |
| 5,017,504 | 5/1991 | Nishimura et al. | 437/40 |
| 5,021,355 | 6/1991 | Dhong et al. | 437/35 |
| 5,028,977 | 7/1991 | Kenneth et al. | 357/43 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,202,278 | 4/1993 | Mathews et al. | 437/47 |
| 5,208,657 | 5/1993 | Chatterjee et al. | 257/302 |
| 5,223,081 | 6/1993 | Doan | 156/628 |
| 5,234,535 | 8/1993 | Beyer et al. | 156/630 |
| 5,266,514 | 11/1993 | Tuan et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/307 |
| 5,414,287 | 5/1995 | Hong | 257/316 |
| 5,416,041 | 5/1995 | Schwalke | 437/62 |
| 5,422,499 | 6/1995 | Manning | 257/67 |
| 5,426,070 | 6/1995 | Shaw et al. | 437/203 |
| 5,438,009 | 8/1995 | Yang et al. | 437/52 |
| 5,440,158 | 8/1995 | Sung-Mu | 257/314 |
| 5,441,591 | 8/1995 | Imthurn et al. | 156/153 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,528,062 | 6/1996 | Hsieh et al. | 257/298 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 465/200 |
| 5,646,900 | 7/1997 | Tsukude et al. | 365/205 |
| 5,691,230 | 11/1997 | Forbes | 437/62 |
| 5,710,057 | 1/1998 | Kenney | 437/62 |
| 5,773,152 | 6/1998 | Okonogi | 428/446 |

OTHER PUBLICATIONS

Quenzer, H.J., et al., "Low Temperature Silicon Wafer Bonding for Micromechanical Applications", Proceedings of the First International Symposium on Semiconductor Wafer Bonding, Gosele, U., et al., (eds.), Electrochemical Society, Pennington, NJ, 92–100, (1992).

"Proceedings of the 1st, 2nd, and 3rd International Symposia on Semiconductor Wafer Bonding: Science, Technology and Applications", The Electrochemical Society Proceedings Series, Electrochemical Society, Pennington, NJ (1992 Issue), 48–62, 92–100, 146–152, (1992–1995).

Abe, et al., "Silicon Wafer–Bonding Process Technology for SOI Structures", Conference on Solid State Devices and Materials, Sponsored by The Japan Society of Applied Physics, 853–856, (1990).

Adler, E., et al., "The Evolution of IBM CMOS DRAM Technology", v, 167–188, (Jan./Mar., 1995).

Asai, S., et al., "Technology Challenges for Integration Near and Below 0.1 micrometer", Proceedings of the IEEE, 85, Special Issue on Nanometer–Scale Science & Technology, 505–520, (Apr. 1997).

Auberton–Herve, A.J., "SOI: Materials to Systems", Digest of the International Electron Device Meeting, San Francisco, 5–10, (Dec. 1996).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", 1994 Symposium on VLSI Technology, Digest of Technical Papers, Honolulu, HI 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chesler, R., et al., "Solid–State Ionic Lasers", *Laser Handbook*, North–Holland Publishing Company, edited by F.T. Arrechi and E.O. Schulz–Dubois, 353, (1972).

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).

De, V.K., et al., "Random MOSFET Parameter Fluctuation Limits to Gigascale Integration (GSI)", 1996 Symposium on VLSI Technology, Digest of Technical Papers, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", IEEE Electron Device Letters, 17, 509–511, (Nov. 1996).

Fong, Y., et al., "Oxides Grown on Textured Single–Crystal Silicon–Dependence on Process and Application in EEPROMs", *IEEE Transactions on Electron Devices*, 37, 583–590, (Mar. 1990).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", In: Tungsten and Other Refractory Metals for VLSI Applications III, V.A. Wells, ed., Materials Res. Soc., Pittsburgh, PA, 69–72, (1988).

Fuse, T., et al., "A 0.5V 200MHz 1–Stage 32b ALU Using a Body Bias Controlled SOI Pass–Gate Logic", 1997 IEEE International Solid–State Circuits Conference, Digest of Technical Papers, 286–287, (1997).

Gagliano, F.P., et al., "Laser Processing Fundamentals", In Lasers in Industry, edited by S.S. Charschan, Van Nostrand Reinhold Company, 156–164, (1972).

Gong, S., et al., "Techniques for Reducing Switching Noise in High Speed Digital Systems", Proceedings of the 8th Annual IEEE International ASIC Conference and Exhibit, 21–24, (1995).

Gosele, U., et al., "Self–propagating Room–temperature Silicon Wafer Bonding in Ultrahigh Vacuum", Applied Physics Letter, 67(24),, 3614–3616 (Dec. 11, 1995).

Hao, M.Y., et al., "Electrical Characteristics of Oxynitrides Grown on Textured Single–Crystal Silicon", Appl. Phys. Lett., 60, 445–447, (Jan. 1992).

Harada, M., et al., "Suppression of Threshold Voltage Variation in MTCMOS/SIMOX Circuit Operating Below 0.5 V", 1996 Symposium on VLSI Technology, Digest of Technical Papers, Honolulu, HI, 96–97, (Jun. 11–13, 1996).

Harendt, et al., "Silicon on Insulator Material by Wafer Bonding", *Journal of Electronic Materials*, 20(3), 267–77, (Mar. 1991).

Heavens, O., *Optical Properties of Thin Solid Films,* Dover Pubs. Inc., New York, 167, (1965).

Hisamoto, D., et al., "A New Stacked Cell Structure for Giga–Bit DRAMs using Vertical Ultra–Thin SOI (DELTA) MOSFETs", 1991 IEEE International Electron Devices Meeting, Technical Digest, Washington, D.C., 959–961, (Dec. 8–11, 1991).

Hodges, D.A., et al., "MOS Decoders", *In: Analysis and Design of Digital Integrated Circuits,* 2nd Edition, Mc–Graw–Hill Book Co., New York, 354–357, (1988).

Holman, W.T., et al., "A Compact Low Noise Operational Amplifier for a 1.2 Micrometer Digital CMOS Technology", *IEEE Journal of Solid–State Circuits,* 30, 710–714, (Jun. 1995).

Hu, G., et al., "Will Flash Memory Replace Hard Disk Drive?", 1994 IEEE International Electron Device Meeting, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Imthurn, et al., "Bonded Silicon–on–Sapphire Wafers and Devices", *Journal of Applied Physics,* 72(6), 2526–7, (Sep. 1992).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits,* 31, 1575–1582, (Nov. 1996).

Kang, H.K., et al., "Highly Manufacturable Process Technology for Reliable 256 Mbit and 1Gbit DRAMs", IEEE International Electron Devices Meeting, Technical Digest, San Francisco, CA, 635–638, (Dec. 11–14, 1994).

Kim, Y.S., et al., "A Study on Pyrolysis DMEAA for Selective Deposition of Aluminum", In: Advanced Metallization and Interconnect Systems for ULSI Applications in 1995, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", Japanese Journal of Applied Physics, 34, 6899–6902, (Dec. 1995).

Kohyama, Y., et al., "Buried Bit–Line Cell for 64MB DRAMs", 1990 Symposium with VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits,* 31, 586–591, (Apr. 1996).

Lantz, II, L., "Soft Errors Induced By Alpha Particles", *IEEE Transactions on Reliability,* 45, 174–179, (Jun. 1996).

Lasky, J.B., "Wafer Bonding for Silicon–on–Insulator Technologies", *Applied Physics Letters,* 48(1), 78–80, (Jan. 6, 1986).

Lee, et al., "Novel Pattern Transfer Process for Bonded SOI Giga–bit DRAMs", IEEE International SOI Conference, Piscataway, NJ, 114–115, (1996).

Lehmann, V., "The Physics of Macropore Formation in Low Doped n–Type Silicon", *Journal of the Electrochemical Society,* 140(10), 2836–2843, (Oct. 1993).

Lu, et al., "Bonding Silicon Wafers by Use of Electrostatic Fields Followed by Rapid Thermal Heating", Materials Letters, 4(11), 461–464, (Oct. 1986).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Phi–Shape Transistor (VPhiT) Cell for 1 Gbit DRAM and Beyond", 1994 Symposium of VLSI Technology, Digest of Technical Papers, Honolulu, HI, 133–134, (Jun. 7–9, 1994).

Masu, K., et al., "Multilevel Metallization Based on Al CVD", 1996 IEEE Symposium on VLSI Technology, Digest of Technical Papers, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology*—Part B, 19, 461–472, (Aug. 1996).

Mumola, et al., "Recent Advances in Thinning of Bonded SOI Wafers by Plasma on Chemical Etching", Proceedings of the Third International Symposium on Semiconductor Wafer Bonding: Physics and Applications, Electrochem. Soc., Pennignton, NJ, 28–32, (1995).

Nitayama, A., et al., "High Speed and Compact CMOS Circuits with Multipillar Surrounding Gate Transistors", *IEEE Transactions on Electron Devices,* 36, 2605–2606, (Nov. 1989).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", 1991 IEEE International Electron Devices Meeting, Washington, D.C., 469–472, (Dec. 8–11, 1991).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D PENCIL Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", IEEE International Electron Devices Meeting, Technical Digest, 11–14, (1993).

Ramo, S., et al., "Fields and Waves in Communication Electronics", John Wiley & Sons, Inc., New York, 3rd ed., 428–433, (1994).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", IEEE International Electron Devices Meeting, Washington, D.C., 714–717, (Dec. 1–4, 1985).

Sagara, K., et al., "A 0.72 micro–meter2 Recessed STC (RSTC) Technology for 256Mbit DRAMs using QuarterMicron Phase–Shift Lithography", 1992 Symposium on VLSI Technology, Digest of Technical Papers, Seattle, WA, 10–11, (Jun. 2–4, 1992).

Seevinck, E., et al., "Current–Mode Techniques for High-Speed VLSI Circuits with Application to Current Sense Amplifier for CMOS SRAM's", *IEEE Journal of SolidState Circuits*, 26, 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su, D.K., et al., "Experimental Results and Modeling Techniques for Substrate Noise in Mixed–Signal Integrated Circuits", *IEEE Journal of Solid–State Circuits*, 28(4), 420–430, (Apr. 1993).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sunouchi, K., et al., "A Surrounding Gate Transistor (SGT) Cell for 64/256Mbit DRAMs", 1989 IEEE International Electron Devices Meeting, Technical Digest, Washington, D.C., 23–26, (Dec. 3–6, 1989).

Sunouchi, K., et al., "Process Integration for 64M DRAM Using an Asymmetrical Stacked Trench Capacitor (AST) Cell", 1990 IEEE International Electron Devices Meeting, San Francisco, CA, 647–650, (Dec. 9–12, 1990).

Sze, S.M., "Physics of Semiconductor Devices", John Wiley & Sons, 42, (1981).

Takai, M., et al., "Direct Measurement and Improvement of Local Soft Error Susceptibility in Dynamic Random Access Memories", Nuclear Instruments & Methods in Physics Research, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", IEEE International Electron Devices Meeting, Technical Digest, 222–225, (1988).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64Mbit and 256Mbit DRAMs", 1991 Symposium on VLSI Technology, Digest of Technical Papers, Oiso, 13–14, (May 28–30, 1991).

Terauchi, M., et al., "A Surrounding Gate Transistor (SGT) Gain Cell for Ultra High Density DRAMs", 1993 Symposium on VLSI Technology, Digest of Technical Papers, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices* 38, 2487–2496, (Nov. 1991).

Vittal, A., et al., "Clock Skew Optimization for Ground Bounce Control", 1996 IEEE/ACM International Conference on Computer–Aided Design, Digest of Technical Papers, San Jose, Ca, 395–399, (Nov. 10–14, 1996).

Wang, N., *Digital MOS Integrated Circuits*, Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", IEEE International Electron Devices Meeting, Technical Digest, San Francisco, CA, 259–262, (Dec. 13–16, 1992).

Watanabe, H., et al., "A Novel Stacked Capacitor with Porous–Si Electrodes for High Density DRAMs", 1993 Symposium on VLSI Technology, Digest of Technical Papers, Kyoto, Japan, 17–18, (1993).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Weldon, M.K., et al., "Physics and Chemistry of Silicon Wafer bonding Investigated by Infrared Absorption Spectroscopy", *Journal of Vacuum Sci. Technology*, B 14(4), c1996 American Vacuum Society, 3095–3106, (Jul./Aug. 1996).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., 35–38, (Dec. 3–6, 1989).

METHODS FOR MAKING SILICON-ON-INSULATOR STRUCTURES

BACKGROUND OF THE INVENTION

The present invention concerns fabrication methods and structures for integrated circuits, particularly methods for making silicon-on-insulator structures.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, typically a round slice of silicon called a wafer. The components are then wired, or interconnected, together to define a specific electric circuit, such as a computer processor or memory.

The evolution of integrated circuits has been driven by three principal objectives: reducing size, lowering power consumption, and increasing operating speed. Silicon-on-insulator (SOI) technology—an emerging technology which entails building silicon devices, such as transistors, on an insulative substrate rather than on a silicon substrate as done typically—dramatically advances all three objectives. First, silicon-on-insulator technology provides superior electrical isolation between adjacent components, which, in turn, allows closer component spacing and integrated-circuit size reductions. Second, silicon-on-insulator technology reduces integrated-circuit capacitance, the primary obstacle to faster operating speeds. And third, it enables use of lower operating voltages, which significantly reduces power consumption.

Unfortunately, conventional methods for implementing silicon-on-insulator technology waste costly silicon, and therefore have been commercially viable in only a few high-priced applications. For instance, one conventional method forms an insulative layer on the top surface of a silicon wafer and bonds the entire surface of another silicon wafer onto the insulative layer, essentially sandwiching the insulative layer between the two silicon wafers. This method then wastefully grinds down one of the silicon wafers to a thin silicon layer, yielding one silicon-on-insulator structure at the cost of two silicon wafers.

A similar method, dubbed "smart cut" by its proponents, is a bit more cost effective. The smart-cut method sandwiches an insulative layer between two silicon wafers, but rather than grinding down one of the wafers, it in effect slices off a thick portion of one wafer, leaving a thin slice of silicon covering the entire insulative layer and saving the thick portion for use in another silicon-insulator-silicon sandwich. Thus, the smart-cut method is emerging as a substitute to the bond-and-grind method.

However, the smart-cut method suffers from at least three shortcomings. First, slicing the silicon wafer entails implanting hydrogen ions into the silicon, some of which remain in the bonded silicon after the slicing procedure, and introduce defects into transistors later formed in the silicon. Second, the smart-cut method indiscriminantly bonds a continuous silicon layer to the entire insulative surface, not only to regions where transistors are desired but also to regions where they aren't. The continuity of the silicon layer forces it to buckle and crack during subsequent processing because the insulation and silicon expand and contract at very different rates in response to temperature changes. Third, the continuity also allows silicon between and around intended transistors to form unintended, or parasitic, devices, for example parasitic diodes and transistors, which compromise isolation, performance, and reliability of the intended transistors.

Accordingly, there is a need for more effective methods of making silicon-on-insulator structures.

SUMMARY OF THE INVENTION

To address these and other needs, the inventor devised a smart-bond technique that allows repeated use of a silicon or more generally a semiconductive wafer to produce hundreds, potentially thousands, of semiconductor-on-insulator structures. Moreover, the smart-bond technique intelligently applies semiconductive material only where semiconductor devices are desired, not only saving semiconductive material, but precluding formation of parasitic devices which would otherwise compromise isolation, performance, and reliability.

More particularly, the smart-bond technique entails bonding or fusing selected first and second regions of a semiconductive substrate to an insulative substrate and then separating the two substrates to leave semiconductive protrusions or islands on the insulative substrate. To reuse the semiconductive substrate, one repeats the bonding and separation to form semiconductive protrusions on another insulative substrate. The semiconductive protrusions can be made into transistors which are interconnected to form integrated circuits which are not only smaller, faster, and more efficient but also less costly than conventional integrated circuits with silicon-on-insulator technology.

Other embodiments apply the selective bonding and substrate separation steps two or more times to make an integrated circuit having two or more circuit levels, in other words, a "three-dimensional" integrated circuit. More particularly, this entails bonding selective regions of a semiconductive substrate to a first insulative substrate to form a first set of semiconductive protrusions, which are then made into a first set of interconnected transistors to form a first circuit level. The bonding and separation are then repeated using the same semiconductive substrate to form a second set of semiconductive protrusions on a second insulative substrate positioned over the first set of interconnected transistors. Transistors are formed from the second set of protrusions and subsequently interconnected to complete a second circuit level. Thus, the present invention also offers an efficient method of making three-dimensional integrated circuits with the performance advantages of silicon-on-insulator technology. dr

DESCRIPTION OF THE PREFERRED EMBODIMENTS

The following detailed description, which references and incorporates FIGS. 1–9, describes and illustrates specific embodiments, or versions, of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

Figure 1:
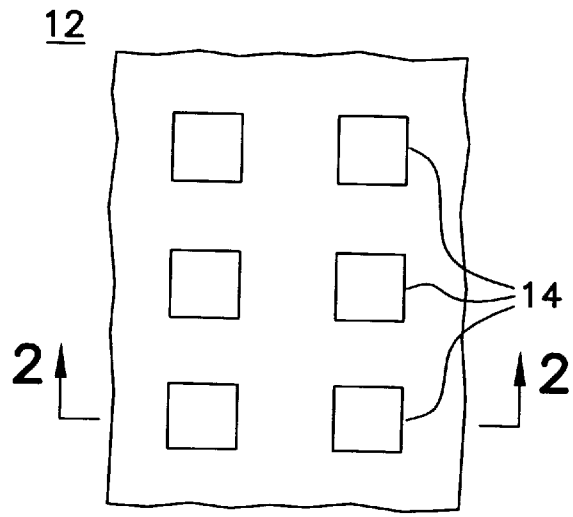
FIG. 1 is a top view of a part of a semiconductive donor substrate 12 having a number of integral semiconductive protrusions 14 for use in fabricating an integrated circuit.

FIGS. 1–8 show a number of views and structures, which taken collectively and sequentially, illustrate an exemplary method of forming an integrated circuit incorporating silicon-on-insulator, and more generally semiconductor-on-insulator technology. The method, as shown in FIG. 1, begins with a semiconductive donor substrate 12. (The term "substrate," as used herein, broadly encompasses any structure or surface, regardless of composition, which may directly or indirectly support all or any portion of an integrated circuit.) Semiconductive donor substrate 12 serves as source of semiconductive material, for example, silicon. However, in other embodiments, donor substrate 12 consists of gallium-arsenic, germanium, silicon-carbide, or combinations of these materials. Thus, the invention is not limited to any particular semiconductive material.

Figure 2:
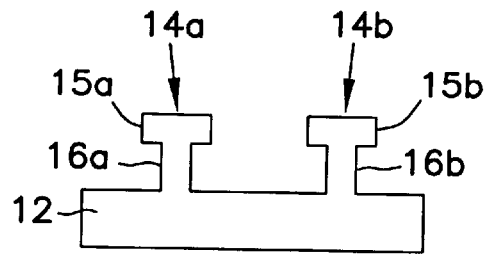
FIG. 2 is a cross-sectional view of donor substrate 12 taken along line 2—2, illustrating two particular semiconductive protrusions 14a and 14b, which include respective top portions 15a and 15b and respective base portions 16a and 16b.

Donor substrate 12 includes a number of semiconductive protrusions or islands 14, which will ultimately be bonded to an insulative substrate to form semiconductor-on-insulator structures. The protrusions are noncontiguous in this embodiment to promote device isolation. FIG. 2, a cross-sectional view of donor substrate 12 taken along line 2—2, particularly shows two semiconductive protrusions 14a and 14b, not only as being integral to substrate 12 but also as including respective planar top portions 15a and 15b and respective base portions 16a and 16b. In this exemplary embodiment, base portions 16a and 16b are narrower than corresponding top portions 15a and 15b. The top portions are generally square in shape with sides of one micron or less; the bases are generally rounder with a diameter of one-half micron or less; and the overall height of the protrusions, which is one micron or less, matches that of the top side dimensions. However, other embodiments of the invention provide various protrusions ranging from heterogeneous, amorphous outcroppings to highly congruent geometric solids. In fact, in one embodiment of the invention, the protrusions comprise whole transistors or portions of transistors, with appropriate doping and so forth. Thus, the invention encompasses any form, shape, and size of protrusion or island.

Protrusions 14 may be formed using any number of techniques. For example, co-pending and co-assigned patent application Ser. No. 08/745,708, teaches a method of forming silicon protrusions. This application, entitled Silicon-on-Insulator Islands and Method for Their Formation, is incorporated herein by reference. In addition, U.S. Pat. No. 5,691,230, entitled Technique for Producing Small Islands of Silicon on Insulator, teaches a technique of forming silicon pillars and fully undercutting them with oxide formations to form silicon-on-insulator structures. The exemplary method adapts this technique to form protrusions 14 by only partially undercutting the pillars.

More particularly, this technique starts with a lightly doped silicon wafer, for example, a p-type wafer, grows or deposits 10-to-30 nanometer-thick, oxide layer on the wafer, and then grows or deposits a 100-nanometer thick layer of silicon nitride atop the oxide layer. Afterward, a series of perpendicularly intersecting trenches are patterned in the nitride and oxide layers to define individual island formations, with the trenches being directionally etched to a depth of around 200 nanometers, measured from the top of the nitride layer into the silicon substrate. The technique next deposits or grows another silicon nitride layer, with a thickness less than 100 nanometers, on the top and sides of the protrusions and then directionally etches away the silicon nitride on the tops, leaving silicon nitride on the sides of the protrusions. To form the narrow base portions, one isotropically etches into the silicon substrate, with the silicon nitride in place to protect the protrusion tops. Lastly, the nitride and oxide are removed to leave protrusions such as those shown in FIGS. 1 and 2.

Figure 3:
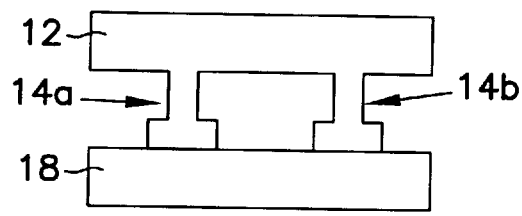
FIG. 3 is a cross-sectional view of an integrated-circuit assembly resulting from bonding or fusing select regions of substrate 12, specifically top portions 15a and 15b of protrusions 14a and 14b, to an insulative substrate 18.

As FIG. 3 shows, the next step bonds or fuses select regions of semiconductive substrate 12, specifically top portions 15a and 15b of protrusions 14a and 14b, to an insulative carrier substrate 18. In the exemplary embodiment, insulative carrier substrate 18 is a smooth, polished, and oxidized insulative layer, such as silicon oxide, which has been grown or deposited on a semiconductive wafer. However, other embodiments provide the insulative carrier substrate as a sapphire or quartz structure optically polished to a smooth finish. Pre-bonding preparations also include oxidizing carrier substrate 18 in a high-temperature, that is 800–1100° C., environment and cleaning the donor and carrier substrates in, for example, a standard RCA or hydrophilization clean.

The actual bonding may follow any number of techniques. Bonding in the exemplary embodiment occurs in the same temperature range used for oxidation. More specifically, it entails placing semiconductive donor substrate 12, specifically top portions 15a and 15b, in contact with portions of the oxidized surface of insulative carrier substrate 18 for a period of time. Some embodiments apply an optional electrostatic force or other clamping force to facilitate a stronger bond than can be achieved under weight of the semiconductive donor substrate alone. A bond between top portions 15a and 15b of donor substrate 12 and contacting portions of the surface of carrier substrate 18 results after about 5 minutes in the high-temperature environment.

After bonding, the semiconductive donor and insulative carrier substrates, which have different thermal-expansion coefficients, are allowed to cool. In the exemplary embodiment, the silicon underlying the insulative layer of the carrier substrate contracts more than the insulative layer, causing carrier substrate 18 to bow and thus to shear, or break, base portions 16a and 16b of protrusion 14a and 14b in two. One then separates donor substrate 12 and the lower-most base portions of protrusions 14a and 14b from carrier substrate 16, leaving top portions 15a and 15b of protrusions 14a and 14b bonded to carrier substrate 18.

Other embodiments break base portions 16a and 16b by heating substrates 12 and 16 above the bonding temperature, again relying on differences in thermal-expansion coefficients of the donor and insulative substrates. Still other embodiments apply a known smart-cut technique which entails hydrogen-ion implantation to create a heat-activatable cleavage plane through the base portions of the protrusions, prior to bonding. Substrates 12 and 16 are then heated to thermally activate the plane, thereby cleaving the protrusion base portions in two. For more details on this approach, refer, for example, to M. Breul et al., "Smart-Cut: A New Silicon on Insulator material technology based on Hydrogen Implantation and Wafer Bonding," (Proceedings 1996 International Conference on Solid State Devices and Materials, Japan, Journal of Applied Physics, Part 1, Vol. 36, no. 3B, pp. 1636–41, 1996) which is incorporated herein by reference. Regardless of the chosen separation technique, the resulting structure resembles FIG. 4, which shows top portions 15a and 15b of the semiconductive protrusions bonded to insulative carrier substrate 18.

Figure 5:
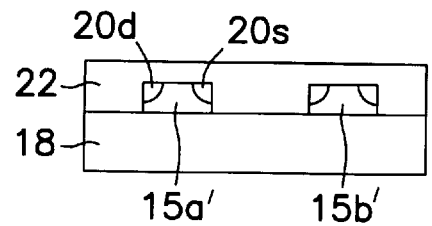
FIG. 5 is a cross-sectional view of the FIG. 4 assembly after planarizing top portions 15a and 15b, forming drain and source regions 20d and 20s, and depositing or growing an overlying gate insulation layer 22.

FIG. 5 shows that the next steps of the exemplary method entails planarizing the bonded protrusions and forming them into respective transistors 15a' and 15b'. The exemplary method applies conventional chemical-mechanical polishing to planarize the top (broken) surfaces of the bonded protrusions. However, a variety of other planarization techniques are available. Some entail doping the protrusions to form etch stops and then etching the protrusions using chemical and plasma-assisted processes. Some embodiments apply these known procedures to reduce the bonded protrusions to ultra-thin semiconductive layers with thicknesses of 100 nanometers or less.

The transistors formed from the bonded protrusions may be of any type. For example, in some embodiments, the transistors are field-effect transistors, floating-gate transistors, bipolar junction transistors, or combinations of two or more of these transistors as in BiCMOS circuits. In fact, the protrusions may be formed into any device or component which can be made from semiconductive material.

The exemplary method forms top portions 15a and 15b into field-effect transistors 15a' and 15b' by treating them as wells in a conventional CMOS process. Accordingly, the portions are doped via ion implantation to form n- or p-type drain and source regions 20d and 20s and a gate insulation layer 22 is deposited or grown over and between the doped protrusions. Notably, the application of oxide or other insulative material over and the between the doped protrusions not only highlights the absence of parasitic devices between the transistors, but also illustrates that the selective, or intelligent, bonding of semiconductive material only where devices are desired simplifies and improves device isolation by omitting material that could form parasitic devices such as transistors and diodes. Parasitic devices compromise reliability by promoting transistor latch-up and other component failures. In contrast, conventional wafer-bond methods, for example those addressed in the Background, indiscriminately bond silicon to the entire surface on an insulative substrate, fostering parasitic device formation and potentially requiring additional, more costly isolation techniques to achieve isolation comparable to the present "smart-bonding" technique.

After forming gate insulation layer 22, the method forms gates 24a and 24b and interconnects them via a conductor 25. The gates and conductor are metal or polysilicon or a combination. Formation of an insulative layer 26 completes fabrication of the structure shown in FIG. 6, which for sake of clarity omits typical drain, source, and body contacts. The structure resembles that of a typical integrated circuit having a single level of components and one or more levels of interconnections.

Figure 7:
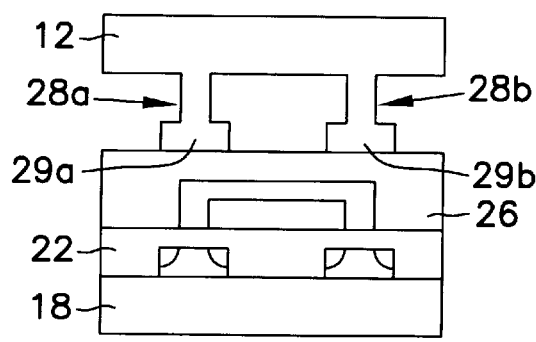
FIG. 7 is a cross-sectional view of the FIG. 6 assembly after forming new protrusions 28a and 28b in semiconductive donor substrate 12 and bonding them to insulative layer 26.

FIG. 7 shows that the basic smart bonding technique for forming semiconductor-on-insulator structures is useful for forming an integrated circuit having two or more circuit levels, with each circuit level including one or more active or passive components and associated interconnections. However, prior to repeating the smart bonding technique with insulative layer 26 serving as a new insulative carrier substrate, semiconductive donor substrate 12 undergoes planarization and protrusion-formation procedures (similar to those already described) to produce a second set of protrusions 28, of which protrusions 28a and 28b are representative. Since each sequence of protrusion formation, protrusion separation, and preparatory planarization operations removes only a few microns of semiconductive material, donor substrate 12 may be reused hundreds or even thousands of times. The protrusions are then bonded to insulative layer 26.

Figure 4:
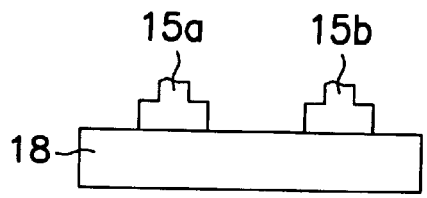
FIG. 4 is a cross-sectional view of the FIG. 3 assembly after separation of semiconductive substrate 12 from insulative substrate 18 leaves top portions 15a and 15b of protrusions 14a and 14b bonded to substrate 18.
Figure 6:
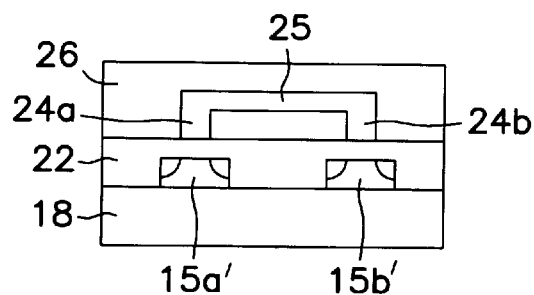
FIG. 6 is a cross-sectional view of the FIG. 5 assembly after forming gates 24a and 24b, an interconnecting conductor 25, and an overlying insulative layer 26.
Figure 8:
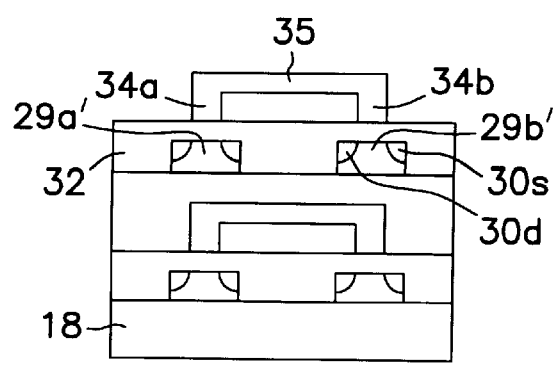
FIG. 8 is a cross-sectional view of the FIG. 7 assembly after separating donor substrate 12 from insulative layer 26, forming top portions 29a and 29b of protrusions 28a and 28b into transistors 29a' and 29b', and interconnecting them through conductor 35.

Subsequently, the exemplary method, in accord with the procedures outlined for FIGS. 4–6, entails separating the bonded top portions 29a and 29b of protrusions 28a and 28b from substrate 12, forming them into transistors 29a' and 29b', and then interconnecting them through conductor 35, as shown in FIG. 8. Other structures formed during this series of steps include drain and source regions 30d and 30s, gate insulation layer 32, and gates 34a and 34b. The resulting "three-dimensional" integrated circuit includes two levels of interconnected components.

Figure 9:
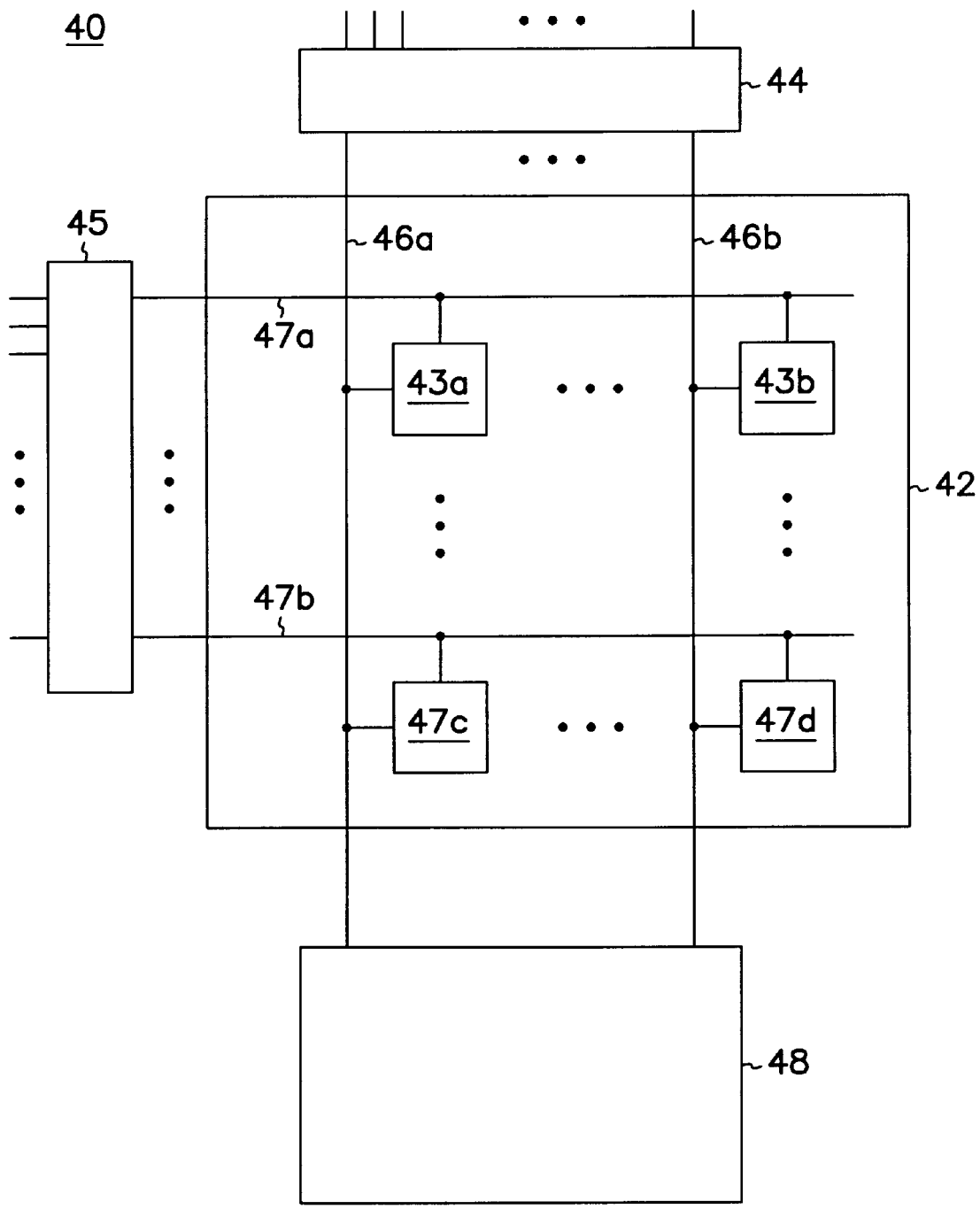
FIG. 9 is a block diagram of a generic integrated memory circuit fabricated in accord with the method and structures of FIGS. 1–8.

Exemplary Embodiment of a Three-Dimensional Integrated Memory Circuit Incorporating Silicon-on-Insulator Structures FIG. 9 shows one example of the unlimited number of integrated circuits which would benefit from incorporation of the silicon-on-insulator structures of the present invention: a generic integrated memory circuit 40. Memory circuit 40, which operates according to well-known and understood principles, is generally coupled to a processor (not shown) to form a computer system. More particularly, circuit 40 includes a memory array 42 which comprises a number of memory cells 43, a column address decoder 44, and a row address decoder 45, bit lines 46, word lines 47, and voltage-sense-amplifier circuit 48 coupled to bit lines 46.

In the exemplary embodiment, the memory cells, the address decoders, and amplifier circuit are formed as silicon-on-insulator devices. Moreover, in other embodiments, certain components, for example, decoders 44 and 45 and amplifier 48, are formed on a different level than memory array 42, not only to minimize the average distance between the cells of array 42 and these components but also to allow for more cells on a given circuit level. Further embodiments even provide three-dimensional, that is, multi-level memory arrays, with each level of the array having its own decoders and amplifier circuits.

CONCLUSION

In furtherance of the art, the inventor has presented a smart-bond technique for making silicon-on-insulator, more generally semiconductor-on-insulator structures. Unlike conventional bonding techniques that covered entire insulative surfaces with silicon, the smart-bond technique attaches semiconductive material only where semiconductive devices are desired, avoiding the buckling and cracking that can occur with continuous silicon coverage, while also achieving better device isolation. In addition, the smart-bond technique allows repeated use of a single semiconductive donor wafer to produce hundreds, even thousands, of semiconductor-on-insulator wafers. Moreover, the smart-bond technique allows fabrication of three-dimensional integrated circuits.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

I claim:

1. A method of making semiconductor-on-insulator structures, which comprises:

forming first and second semiconductive protrusions which are attached to a substrate;

bonding portions of the first and second protrusions to an insulative surface; and thermally expanding or contracting the insulative surface to break each of the protrusions into at least two portions, with one of the two portions being bonded to the insulative surface.

2. The method of claim 1, wherein the substrate consists essentially of a semiconductive material.

3. The method of claim 2, wherein forming the first and second protrusions comprises:

forming first and second elevated areas in a semiconductor layer, each elevated area having a top;

partially undercutting the first and second elevated areas to form respective first and second base portions narrower than its corresponding top.

4. The method of claim 1 further comprising:

forming the semiconductive protrusion into one or more transistors;

forming an insulative layer over the one or more transistors;

bonding one or more semiconductive structures to the insulative layer.

5. A method of making an integrated circuit having semiconductor-on-insulator structures, which comprises:

attaching two or more semiconductive structures to an insulative surface;

forming one or more transistors from the semiconductive structures;

forming two or more semiconductive protrusions integral to a semiconductive substrate;

placing the two or more semiconductive protrusions in contact with the insulative surface; and thermally expanding or contracting the insulative surface to separate at least a portion of each protrusion from the semiconductive substrate.

6. A method of making semiconductor-on-insulator structures, which comprises:

forming two or more semiconductive structures attached to a substrate;

attaching the two or more semiconductive structures to an insulative surface;

thermally expanding or contracting the insulative surface to separate at least a portion of each semiconductive structure from the substrate; and forming the two or more semiconductive structures into two or more transistors.

7. The method of claim 6 wherein forming the semiconductive structures into two transistors occurs after attaching the two semiconductive structures to the insulative surface.

8. A method of making an integrated circuit, which comprises:

forming two or more semiconductive structures;

attaching the two or more semiconductive structures to an insulative surface; and thermally expanding or contracting the insulative surface to separate at least a portion of each semiconductive structure from the substrate.

9. The method of claim 8 wherein the two semiconductive structures are semiconductive protrusions integral to a semiconductive substrate.

10. The method of claim 8 further comprising forming the two semiconductive structures into two transistors.

11. The method of claim 10 wherein forming the semiconductive structures into two transistors occurs after bonding the two semiconductive structures to the insulative substrate.

12. A method of making an integrated circuit, which comprises:

bonding a first group of two or more semiconductive structures to an insulative surface;

forming a first group of two or more transistors from the first group of semiconductive structures;

interconnecting the first group of transistors;

forming an insulative layer over the first group interconnected transistors;

bonding a second group of two or more semiconductive structures to the insulative layer;

forming a second group of transistors from the second group of semiconductive structures; and interconnecting the second group of transistors.

13. A method of making an integrated circuit, which comprises:

forming a first circuit level including a first group of two or more interconnected transistors;

forming an insulative layer over the first group interconnected transistors;

bonding a group of two or more semiconductive structures to the insulative layer; and forming a second group of two or more interconnected transistors from the group of semiconductive structures.

14. A method of making semiconductor-on-insulator structures, which comprises:

forming first and second semiconductive protrusions which are attached to a substrate;

bonding portions of the first and second protrusions to an insulative surface;

forming a thermally-activatable cleavage plane through the first and second protrusions; and activating the thermally-activatable cleavage plane to separate each of the protrusions into at least two portions, with one of the two portions being bonded to the insulative surface.

15. The method of claim 14 wherein forming the thermally-activatable cleavage plane comprises implanting ions into the first and second protrusions.

16. The method of claim 14 wherein activating the thermally-activatable cleavage plane comprises heating the protrusions.

* * * * *